(12) United States Patent
Brucker

(10) Patent No.: US 7,300,558 B2
(45) Date of Patent: Nov. 27, 2007

(54) RAPID CYCLE TIME GAS BURSTER

(75) Inventor: Charles F. Brucker, Pleasanton, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 750 days.

(21) Appl. No.: 10/689,057

(22) Filed: Oct. 21, 2003

(65) Prior Publication Data

US 2005/0082161 A1    Apr. 21, 2005

(51) Int. Cl.
C23C 14/34 (2006.01)
C23C 10/00 (2006.01)

(52) U.S. Cl. ............... 204/192.12; 204/298.07; 204/298.33; 156/345.29; 156/345.33; 118/715; 118/723 E; 118/723 ER; 427/569; 427/248.1; 427/255.23; 216/58; 216/67

(58) Field of Classification Search ........... 204/192.12, 204/298.07, 298.33; 156/345.29, 345.33; 118/723 E, 723 ER, 715; 427/569, 248.1, 427/255.23; 216/58, 67
See application file for complete search history.

(56) References Cited

U.S. PATENT DOCUMENTS

| | | | |
|---|---|---|---|
| 4,989,160 A | 1/1991 | Garrett et al. | |
| 5,049,251 A | 9/1991 | Inoue | |
| 5,873,942 A | 2/1999 | Park et al. | |
| 5,879,461 A | 3/1999 | Adams | |
| 5,907,220 A | 5/1999 | Tepman et al. | |
| 5,942,089 A | 8/1999 | Sproul et al. | |
| 6,080,286 A | 6/2000 | Okuda et al. | |
| 6,103,069 A | 8/2000 | Davenport | |
| 6,537,428 B1 | 3/2003 | Xiong et al. | |
| 2003/0064253 A1 | 4/2003 | Uwazumi et al. | |

*Primary Examiner*—Rodney G. McDonald
(74) *Attorney, Agent, or Firm*—McDermott Will & Emery LLP

(57) ABSTRACT

An apparatus for rapidly establishing at least one preselected gas pressure in a process chamber comprising:
(a) a chamber defining an interior space adapted to be maintained at a reduced pressure; and
(b) a gas supply means for supplying at least one burst of gas to the chamber for rapidly establishing the at least one preselected gas pressure in the chamber, the gas supply means including:
(i) a source of the gas;
(ii) a supply ballast fluidly connected to the gas source for receiving the gas from the source;
(iii) at least one burst ballast fluidly connected to the supply ballast via a metering valve for receiving the gas from the supply ballast; and
(iv) an on/off valve fluidly connected to the at least one burst ballast and the chamber for supplying the process chamber with the gas from the at least one burst ballast.

18 Claims, 3 Drawing Sheets

RAPID CYCLE TIME GAS BURSTER

FIELD OF THE INVENTION

The present invention relates to means and methodology for providing a burst of gas to a low pressure (i.e., vacuum) processing chamber for rapidly cycling between preselected lower and higher gas pressures. The invention enjoys particular utility in the manufacture of magnetic and/or magneto-optical (MO) data/information storage and retrieval media, e.g., hard disks, by means of reactive sputter deposition processing.

BACKGROUND OF THE INVENTION

Magnetic and MO recording media are widely employed in various applications, particularly in the computer industry for data/information storage and retrieval purposes. A magnetic medium in, e.g., disk form, such as utilized in computer-related applications, comprises a non-magnetic substrate, for example, of glass, ceramic, glass-ceramic composite, polymer, metal or metal alloy, typically an aluminum (Al)-based alloy such as aluminum-magnesium (Al—Mg), having at least one major surface on which a layer stack comprising a plurality of thin film layers constituting the medium are sequentially deposited. In the case of longitudinal type magnetic recording media, such layers may include, in sequence from the substrate deposition surface, a plating layer, e.g., of amorphous nickel-phosphorus (Ni—P), a polycrystalline underlayer, typically of chromium (Cr) or a Cr-based alloy such as chromium-vanadium (Cr—V), a longitudinally oriented magnetic layer, e.g., of a cobalt (Co)-based alloy, and a protective overcoat layer, typically of a carbon (C)-based material, such as diamond-like carbon (DLC), having good mechanical (i.e., tribological) and corrosion resistance properties.

Perpendicular type magnetic recording media typically comprise, in sequence from the surface of a non-magnetic substrate, an underlayer of a magnetically soft material, at least one non-magnetic interlayer or intermediate layer, a vertically (i.e., perpendicularly) oriented recording layer of a magnetically hard material, and a protective overcoat layer.

A similar situation exists with magneto-optical (MO) media, wherein a layer stack is formed which comprises a reflective layer, typically of a metal or metal alloy, one or more rare-earth thermo-magnetic (RE-TM) alloy layers, one or more dielectric layers, and a protective overcoat layer, for functioning as reflective, transparent, writing, writing assist, and read-out layers, etc.

According to conventional manufacturing technology, a majority (if not all) of the above-described layers constituting multi-layer longitudinal and perpendicular magnetic media, as well as MO recording media, are deposited by means of cathode sputtering processing. For example, the magnetic recording layers are typically fabricated by sputter depositing a Co-based alloy film, wherein the alloying elements are selected to promote desired magnetic and microstructural properties. In the case of longitudinal-type magnetic disk recording media, metallic and metalloidal elements, such as, for example, Cr, Pt, Ta, B, and combinations thereof, have been found to be effective. Similar alloying elements have been found to be useful in the case of perpendicular-type magnetic disk recording media, and in addition, reactive sputter deposition of the Co-based alloys in an oxygen ($O_2$)-containing atmosphere to form so-called "granular" magnetic recording layers/media has been found to be especially effective in controlling (i.e., limiting) exchange coupling between adjacent magnetic grains. In a typical reactive sputtering process utilized for formation of "granular" perpendicular-type magnetic recording media, $O_2$ gas is mixed with an inert sputtering gas, e.g., Ar, and is consumed by the depositing Co-based alloy magnetic film.

FIG. 1 is a simplified, schematic, perspective view of a portion of a conventional reactive sputtering apparatus 1 which may be utilized for performing reactive sputtering of magnetic thin films as part of the process for manufacturing disk-shaped magnetic recording media. As illustrated, the apparatus comprises a vacuum chamber 16 equipped with an opening for connection to a pumping means for evacuating the interior of the chamber; at least one, preferably a pair of facing sputtering targets or sources of conventional type, e.g., a pair of magnetron sputtering guns; a means for positioning a substrate/workpiece in the space between the pair of facing sputtering sources, illustratively a disk-shaped substrate for a magnetic recording medium, for receipt of sputtered particle flux therefrom on both substrate surfaces; and a gas injector having a gas inlet portion extending outside the chamber and connected to a source of a gas, e.g., a mixture of a reactive gas (such as $O_2$) and an inert sputtering gas (such as Ar), and a gas outlet portion within the chamber, for injecting the gas or gas mixture into the space between the pair of facing sputtering sources. Illustratively, the gas injector is "wishbone"-shaped, and comprises a linearly elongated, tubular inlet portion having a first, gas inlet end, and a second end, with a pair of arcuately-shaped, tubular gas outlet portions extending from the second end, comprising a plurality of spaced-apart gas outlet orifices.

The recording layer(s) of the above-mentioned "granular" perpendicular magnetic disk media is (are) typically formed by reactive sputtering at higher pressures than those utilized for the manufacture of "conventional" longitudinal and perpendicular magnetic recording media. Specifically, the recording layer(s) of "granular" perpendicular media is (are) typically formed at about 30 mTorr, whereas the recording layer(s) of "conventional" longitudinal and perpendicular magnetic recording media is (are) typically formed at about 5 mTorr or less. For one-disk-at-a-time sputtering apparatus utilized in the hard disk manufacturing industry, e.g., the Intevac MDP-250 (Intevac Co., Santa Clara, Calif.), the interval for filling and stabilizing the gas pressure in the process chamber at the high operating pressures required for the "granular" perpendicular media can be a significantly limiting factor in obtaining adequate manufacturing throughput for economic competitiveness. This is due, in part, to the relatively long time constants of the active gas flow controllers conventionally employed in the hard disk manufacturing industry, which conventional controllers require sensing of the thermal conductance of the flowing gas, and to the limited operating ranges of such type controllers.

In view of the foregoing, there exists a clear need for improved means and methodology for providing a burst of gas to a low pressure (i.e., vacuum) processing chamber, e.g., a reactive sputtering chamber, for rapidly cycling between preselected lower and higher gas pressures, in order to achieve increased processing throughput. Specifically, there exists a need for improved means and methodology for manufacturing magnetic recording media, e.g., "granular" perpendicular media in the form of hard disks, by reactive sputtering techniques performed at throughput rates consistent with the economic requirements of automated manufacturing processing. In particular, there exists a need for improved means and methodology for overcoming the above-described drawbacks and disadvantages associated with reactive sputtering processing for the manufacture of hard disk magnetic and MO recording media utilizing conventional gas flow controllers, notably their relatively long time constants and limited operating ranges.

The present invention addresses and solves the problems, disadvantages, and drawbacks described supra in connection with conventional one-at-a-time means and methodology for performing reactive sputtering, e.g., of oxide-containing perpendicular recording layers of "granular" magnetic media, while maintaining full compatibility with all aspects of conventional automated manufacturing technology for hard disk magnetic and MO recording media. Further, the means and methodology afforded by the present invention enjoy diverse utility in the manufacture of all manner of devices and products requiring formation of thin films by means of reactive sputtering processing.

DISCLOSURE OF THE INVENTION

An advantage of the present invention is an improved apparatus for rapidly establishing at least one preselected gas pressure in a process chamber.

Another advantage of the present invention is an improved apparatus for rapidly establishing at least one preselected pressure of a reactive gas in a reactive sputtering chamber.

Yet another advantage of the present invention is an improved method for rapidly establishing at least one preselected gas pressure in a reduced pressure chamber.

A further advantage of the present invention is an improved method for rapidly establishing at least one preselected pressure of a reactive gas in a sputtering chamber.

Additional advantages and other features of the present invention will be set forth in the description which follows and in part will become apparent to those having ordinary skill in the art upon examination of the following or may be learned from the practice of the present invention. The advantages of the present invention may be realized and obtained as particularly pointed out in the appended claims.

According to an aspect of the present invention, the foregoing and other advantages are obtained in part by an apparatus comprising:

(a) a chamber defining an interior space adapted to be maintained at a reduced pressure; and (b) a gas supply means for supplying at least one burst of gas to the chamber for rapidly establishing at least one preselected gas pressure in the chamber, the gas supply means including:

(i) a source of the gas;

(ii) a supply ballast fluidly connected to the gas source for receiving the gas from the source;

(iii) at least one burst ballast fluidly connected to the supply ballast via a metering valve for receiving the gas from the supply ballast; and (iv) an on/off valve fluidly connected to the at least one burst ballast and the chamber for supplying the process chamber with the gas from the at least one burst ballast.

According to embodiments of the present invention, the chamber includes means for mounting at least one substrate/workpiece in the interior space, and according to a preferred embodiment, the means for mounting at least one substrate/workpiece in the interior space comprises means for mounting at least one disk-shaped substrate for a magnetic or magneto-optical (MO) recording medium.

In accordance with further preferred embodiments of the invention, the chamber is a process chamber and includes means for performing at least one process treatment on the at least one substrate/workpiece; e.g., the chamber includes means for performing at least one thin film deposition process on the at least one substrate/workpiece, such as at least one sputter deposition process on the at least one substrate/workpiece.

Still further preferred embodiments of the present invention include those wherein the chamber includes means for performing at least one reactive sputter deposition process on the at least one substrate/workpiece, and the gas supply means supplies at least one reactive gas to the chamber.

According to yet further preferred embodiments of the invention, the gas supply means is adapted for sequentially supplying a plurality of different bursts of gas to the chamber for rapidly establishing a respective plurality of preselected gas pressures in the chamber, the gas supply means including a plurality of burst ballasts fluidly connected to the supply ballast via respective metering valves, and a corresponding plurality of on/off valves fluidly connected to respective ones of the plurality of burst ballasts and the chamber for supplying the process chamber with the gas from a selected one of the plurality of burst ballasts.

An example of a preferred embodiment of the present invention is one wherein the gas supply means is adapted for sequentially supplying first and second bursts of gas to the chamber for rapidly establishing respective first and second preselected gas pressures in the chamber, the gas supply means comprising first and second burst ballasts fluidly connected to the supply ballast via respective first and second metering valves, and first and second on/off valves respectively fluidly connected to the first and second burst ballasts and the chamber for supplying the process chamber with the gas from a selected one of the first and second burst ballasts.

In accordance with still further embodiments of the present invention, the apparatus further comprises:

(c) means for controlling operation of the on/off valve, e.g., computer control means.

Another aspect of the present invention is a method, including steps for rapidly establishing at least one preselected gas pressure in a reduced pressure chamber, comprising steps of:

(a) providing an apparatus comprising:

(i) a chamber defining an interior space adapted to be maintained at a reduced pressure; and (ii) a gas supply means for supplying at least one burst of gas to the chamber for rapidly establishing at least one preselected gas pressure in the chamber, the gas supply means including:

(1) a source of the gas;

(2) a supply ballast fluidly connected to the gas source for receiving the gas from the source;

(3) at least one burst ballast fluidly connected to the supply ballast via a metering valve for receiving the gas from the supply ballast; and (4) an on/off valve fluidly connected to the at least one burst ballast and the chamber for supplying the process chamber with the gas from the at least one burst ballast.

(b) providing the supply ballast with the gas from the source;

(c) providing the at least one burst ballast with the gas from the supply ballast;

(d) providing the chamber with a burst of the gas from the at least one burst ballast to establish the at least one preselected gas pressure in the chamber; and (e) providing a steady flow of the gas from the at least one burst ballast to the chamber to maintain the at least one preselected gas pressure therein.

According to embodiments of the present invention, step (a) comprises providing a process chamber including means for mounting at least one substrate/workpiece in the interior space and means for performing at least one process treatment on the at least one substrate/workpiece; step (c) comprises equilibrating the gas pressure in the at least one burst ballast with the gas pressure in the supply ballast, while maintaining the on/off valve in a closed, off position, and setting the pressure×volume (PV) product of the gas in the burst ballast at a level sufficient to rapidly establish the at least one preselected gas pressure in the chamber in step (d); step (d) comprises maintaining the on/off valve in an open, on position; and step (e) comprises utilizing the metering valve to provide the steady flow of the gas from the at least one burst ballast to the chamber to maintain the at least one preselected gas pressure therein.

Preferred embodiments of the present invention include those wherein step (a) comprises providing a process chamber including means for mounting at least one substrate/workpiece in the interior space; e.g., at least one disk-shaped substrate/workpiece for a magnetic or magneto-optical recording medium; and the process chamber includes means for performing at least one thin film deposition process on the at least one substrate/workpiece, e.g., means for performing at least one sputter deposition process on the at least one substrate/workpiece.

Particularly preferred embodiments of the present invention include those wherein step (a) comprises providing a process chamber including means for performing at least one reactive sputter deposition process on the at least one substrate/workpiece and a source of gas including at least one reactive gas.

Further preferred embodiments of the present invention include those wherein step (a) comprises providing a gas supply means adapted for sequentially supplying a plurality of different bursts of gas to the chamber for rapidly establishing a respective plurality of preselected gas pressures in the chamber, the gas supply means including a plurality of burst ballasts fluidly connected to the supply ballast via respective metering valves, and a corresponding plurality of on/off valves fluidly connected to respective ones of the plurality of burst ballasts and the chamber for supplying the process chamber with the gas from a selected one of the plurality of burst ballasts.

Still further preferred embodiments of the present invention include those wherein step (a) comprises providing a gas supply means adapted for sequentially supplying first and second bursts of gas to the chamber for rapidly establishing respective first and second preselected gas pressures in the chamber, the gas supply means comprising first and second burst ballasts fluidly connected to the supply ballast via respective first and second metering valves, and first and second on/off valves respectively fluidly connected to the first and second burst ballasts and the chamber for supplying the process chamber with the gas from a selected one of the first and second burst ballasts.

Additional advantages and aspects of the present invention will become readily apparent to those skilled in the art from the following detailed description, wherein embodiments of the present invention are shown and described, simply by way of illustration of the best mode contemplated for practicing the present invention. As will be described, the present invention is capable of other and different embodiments, and its several details are susceptible of modification in various obvious respects, all without departing from the spirit of the present invention. Accordingly, the drawings and description are to be regarded as illustrative in nature, and not as limitative.

BRIEF DESCRIPTION OF THE DRAWINGS

The following detailed description of the embodiments of the present invention can best be understood when read in conjunction with the following drawings, in which the various features are not necessarily drawn to scale but rather are drawn as to best illustrate the pertinent features and wherein like reference numerals are employed throughout for designating like figures, wherein.

DESCRIPTION OF THE INVENTION

Figure 1:
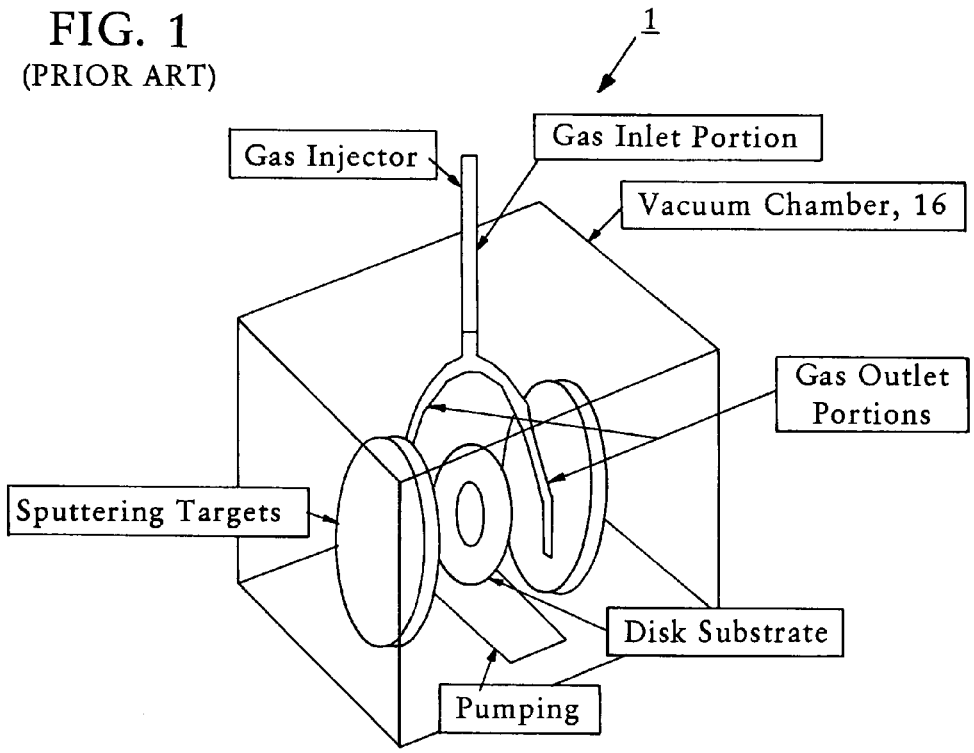
FIG. 1 is a simplified, schematic, perspective view of a "one-at-a-time" reactive sputtering apparatus conventionally utilized for fabricating disk-shaped magnetic and magneto-optical (MO) recording media by means of sputter deposition processing, including reactive sputter deposition.

The present invention is based upon recognition by the inventors that apparatus comprising a reduced pressure (i.e., vacuum) chamber in which at least one substrate/workpiece is subjected to at least one process treatment, may be provided with gas supply means enabling rapid transition (i.e., "bursting") from a first pressure to a preselected second pressure, thereby enabling a significant decrease in pressure cycling time when utilized with continuously operating apparatus for automated manufacture and providing increased product throughput for economic competitiveness.

The inventive apparatus and methodology enjoys particular utility in instances where the process treatment apparatus is of the "one-of-a-kind" type, such as sputter deposition apparatus utilized for the continuous, automated manufacture of magnetic and/or magneto-optical (MO) recording media, e.g., hard disks, which sputter deposition apparatus may be required to operate at a first chamber pressure (e.g., a lower pressure) for sputter deposition of, e.g., an underlayer, and at a second, higher, chamber pressure for reactive sputter deposition of a recording layer, e.g., a perpendicular magnetic recording layer of granular type.

Advantageously, the inventive apparatus comprises conventional, readily available components, and is uncomplicated in design and operation. According to the invention, a supply ballast chamber and at least one burst ballast chamber are sequentially provided in fluid connection with the supply (source) of gas and the process treatment chamber. Specifically, gas supplied from the source to the supply ballast is flowed to the at least one burst ballast via a metering valve and then flowed to the process chamber via a controllable on/off valve. When the on/off valve is closed, the pressure within the at least one burst ballast equilibrates with the pressure within the supply ballast. If the pressure×volume (PV) product of the gas in the at least one burst ballast is properly adjusted, a preselected higher gas pressure in the process treatment chamber can be obtained virtually instantaneously when the on/off valve is opened, essentially limited only by the conductance of the gas manifold. Subsequent to the initial increase in gas pressure ("burst") in the process treatment chamber upon opening of the on/off valve, a steady flow of gas to the process treatment chamber is provided by the normally open metering valve (pre-adjusted to a desired flow rate) to maintain the desired operating pressure in the process treatment chamber until the on/off valve is closed, at which time the burst ballast begins re-pressurizing in preparation for the next process treatment cycle.

Apparatus according to the invention is robust and reliable for operation in continuous manufacturing processing. Advantageously, only the on/off valve is under active process control during typical operation, in that the metering valves do not require adjustment subsequent to initial calibration for use in a particular application. The only other significant parameter requiring operator attention is the supply gas pressure, which must be maintained constant at a preselected value for the application. Feedback control of the supply ballast pressure(s) is independent of process control.

Figure 2:
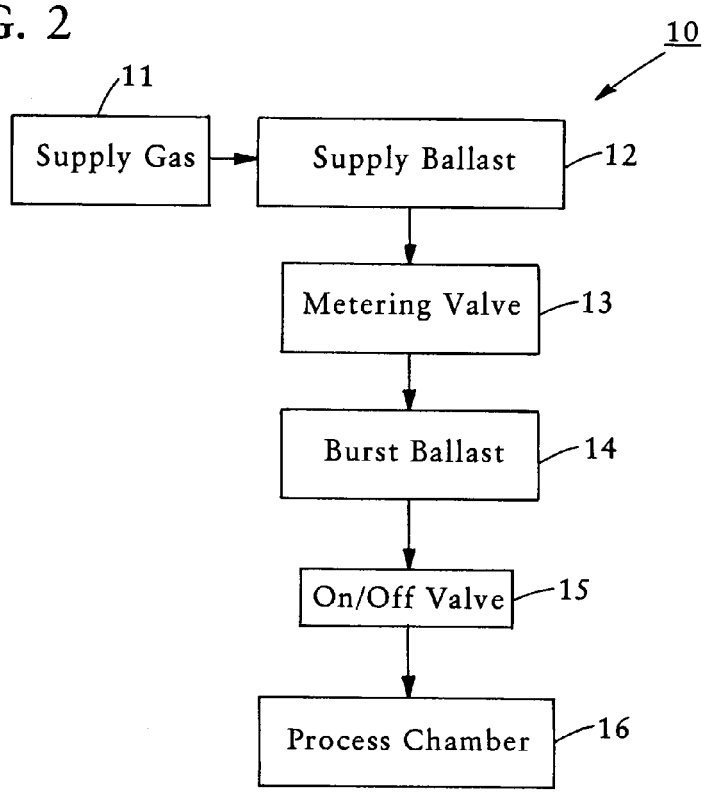
FIG. 2 is a simplified, block diagram of an embodiment of a rapid cycle time gas burst apparatus according to the present invention.

Referring now to FIG. 2, shown therein is a simplified, block diagram of an embodiment of a rapid cycle time gas burst apparatus/system 10 according to the present invention, for use in rapidly cycling the pressure in a reduced pressure process treatment chamber from a first, lower pressure to a second, higher pressure. As illustrated, gas burst apparatus/system 10 comprises a supply gas source 11 adapted for supplying a preselected gas (or a mixture of gases, e.g., $O_2$/Ar for performing reactive sputter deposition of granular-type perpendicular magnetic recording layers as part of a process sequence for the manufacture of hard disk magnetic recording media) at a preselected pressure (e.g., ~10 psi) to a supply ballast chamber 12 for maintaining the gas or gas mixture at a preselected pressure (e.g., ~10 Torr). Typically, the pressure in the supply ballast chamber 12 is maintained at the preselected pressure by closed-loop control means (not shown in the figure for illustrative simplicity), independent of the process control means.

Burst ballast chamber 14 is fluidly connected to supply ballast chamber 12 via metering valve 13, e.g., a passive needle valve, is pre-adjusted to provide a desired flow rate for the application, and normally maintained in an open position. The burst ballast chamber 14 is appropriately sized for the application, i.e., in order to achieve substantially the same gas pressure as that of the supply ballast chamber 12, e.g., ~10 Torr. The burst ballast chamber 14 is also fluidly connected, via on/off valve 15, to process treatment chamber 16. In operation of apparatus/system 10, the pressure× volume (PV) products of the burst ballast chamber 14 and the process treatment chamber 16 are set to be equal, such that $(PV)_{burst\ ballast\ chamber} = (PV)_{process\ treatment\ chamber}$, whereby a preselected (higher) pressure can be very quickly achieved in process treatment chamber 16 upon opening of on/off valve 15 (the only component of apparatus/system 10 controlled by the process). Illustratively, for a 10 Torr supply ballast and burst ballast pressure (burst ballast chamber size of a few cc), apparatus/system 10 according to the invention is capable of achieving a pressure of 30 mTorr in a 4,000 cc process treatment chamber in less than about 1 sec. As indicated supra, upon opening of on/off valve 15, a steady flow of gas to the process treatment chamber is provided by the normally open metering valve 13, which is pre-adjusted to a desired flow rate, in order to maintain the desired operating pressure in the process treatment chamber until the on/off valve is closed, at which time the burst ballast begins re-pressurizing in preparation for the next process treatment cycle.

Figure 3:
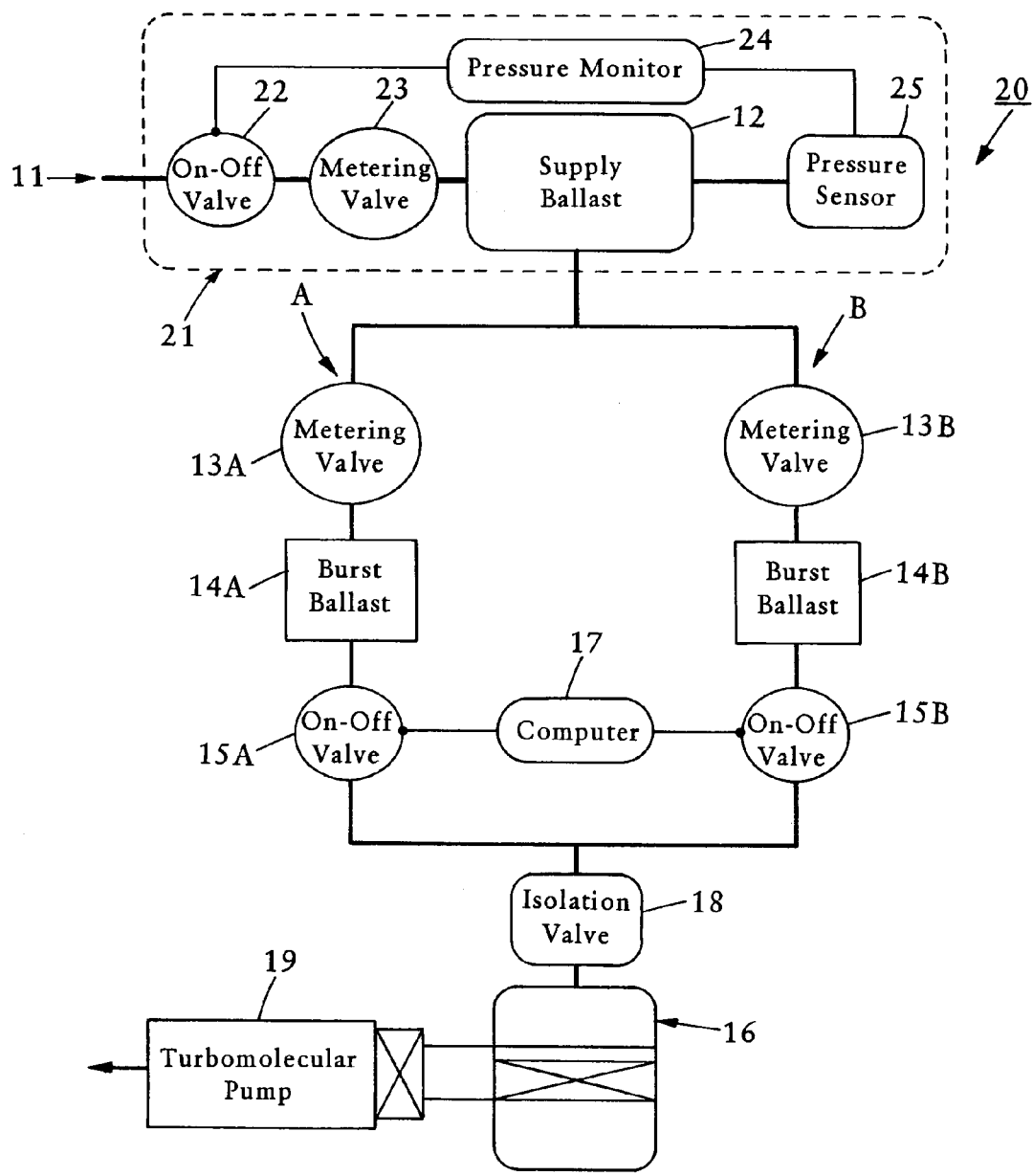
FIG. 3 is a block diagram of another embodiment of a rapid cycle gas burst apparatus according to the present invention, adapted for sequentially establishing a plurality (illustratively a pair) of different preselected gas pressures in a process treatment chamber.

Adverting to FIG. 3, illustrated therein is a block diagram of another embodiment of a rapid cycle gas burst apparatus/system 20 according to the present invention, adapted for sequentially establishing a plurality (illustratively a pair) of different preselected gas pressures in a process treatment chamber 16. As illustrated, apparatus 20 comprises a relatively high pressure gas supply source 11 fluidly connected to an input of a relatively low pressure gas supply 21, the latter comprised of inlet on-off valve 22 connected at an inlet side to gas supply source 11 and at an outlet side to metering valve 23, for flowing gas to supply ballast chamber 12. A feedback loop for controlling the pressure in supply ballast chamber 12 is provided by means of pressure sensor 25 operatively connected as input to pressure monitor/controller 24, the output of which is operatively connected to inlet on-off valve 22.

Gas supply ballast 12 is fluidly connected to a pair of similarly-configured branches A, B for supplying different gas bursts to process/treatment chamber 16. While a pair of such similarly-configured branches are shown in the illustrated embodiment, apparatus/system 20 may, if desired or necessary, comprise a greater number of similarly-configured branches A, B, C, etc., each branch including a respective metering valve 13A, 13B, etc., for receiving gas from supply ballast 12 and supplying gas to respective burst ballast chambers 14A, 14B, etc. Each branch is further provided with a respective on/off valve 15A, 15B, etc., each on/off valve operated by a common control means, illustratively computer 17, for selectively supplying gas to process/treatment chamber 16 via isolation valve 18. Pump means 19, comprising a turbomolecular pump, is operatively connected to process/treatment chamber for maintaining the interior of the latter at a desired low pressure.

Operation of apparatus/system 20 will now be described with reference to the following illustrative, non-limiting example, wherein apparatus/system 20 is adapted for use in manufacture of "granular" perpendicular magnetic recording media, as described supra, and is designed to provide 4,000 cc process/treatment chamber 16 with a first gas burst to ~3 mTorr for sputter deposition of an underlayer and with a second gas burst to ~30 mTorr for reactive sputter deposition of the "granular" magnetic recording layer. The design is premised on the burst ballast chambers 14A and 14B each having a relatively small size, i.e., on the order of several cc, which size is compact but which allows for easy adjustment of the interior volume, such as, for example, by adding or removing small filler beads of an inert material, e.g., glass. In one example, branch A comprised a burst ballast chamber 14A with a 1.2 cc volume for providing the 3 mTorr gas burst and branch B comprised a burst ballast chamber 14B with a 12 cc volume for providing the 30 mTorr gas burst. The volumes of the burst ballast chambers 14A and 14B in turn dictate that the pressure in the supply ballast chamber 12 be 10 Torr, such that the PV product for high pressure burst ballast chamber 14B, i.e., 10 Torr×12 cc=120 Torr-cc be equal to the PV product for process/treatment chamber 16, i.e., 30 mTorr×4,000 cc=120 Torr-cc; and the PV product for low pressure burst ballast chamber 14A, i.e., 10 Torr×1.2 cc=12 torr-cc be equal to the corresponding PV product for the process/treatment chamber, i.e., 3 mTorr×4,000 cc=12 Torr-cc.

Figure 4:
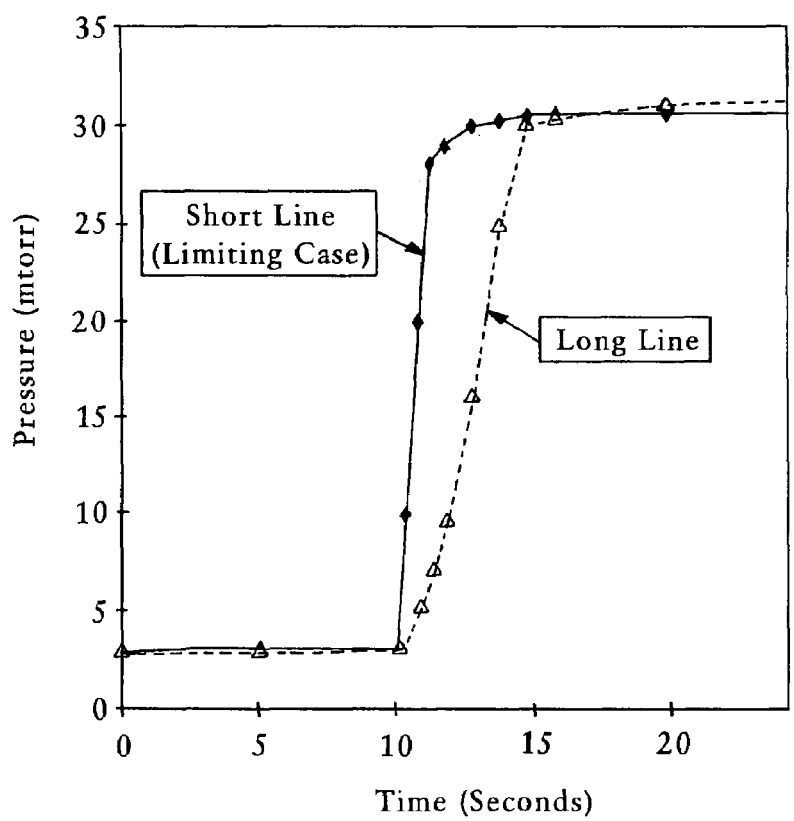
FIG. 4 is a graph for illustrating the measured response of the embodiment of FIG. 3 when increasing the gas pressure in the chamber ("bursting") from 3 to 30 mTorr.

Referring to FIG. 4, shown therein is a graph for illustrating the measured response of the embodiment of FIG. 3 when the gas pressure in process/treatment chamber 16 is increased ("burst") from 3 to 30 mTorr. The response time for apparatus/system 20 to reach 90% of the set point pressure level is ~4.4 sec. for a relatively long delivery line for supplying gas to the process/treatment chamber, and ~1.2 sec. for a relatively short gas delivery line. Further shortening of the gas delivery line did not result in additional improvement in the response time, indicating that the response was limited by the time constant of the pressure measurement transducer, i.e., a capacitance manometer. Therefore, it is considered that the true response time for apparatus/system 20 is $\leq 1.2$ sec.

After "bursting" gas to process/treatment chamber 16 to reach the pressure set-point, the pressure is maintained for as long as is desired by the steady gas flow provided by the respective metering valve 13A, 13B, etc. At the end of the process, the respective on/off valve 15A, 15B, etc., is closed upon command from computer controller 17, and the respective burst ballast chamber 14A, 14B, etc., re-pressurizes with a respective time constant, i.e., ~0.95 sec. for burst ballast chamber 14A and ~2.37 sec. for burst ballast chamber 14B. Supply ballast chamber 12 is designed to provide a substantially constant "backing pressure" of 10±0.5 Torr by means of closed-loop actuation of on/off valve 22. The volume of supply ballast chamber 12 is sufficiently large, i.e., $\geq 2.6$ liters, such that the fully pressurized dead volume between on/off valve 22 and metering valve 23 cannot produce a pressure rise greater than ~0.5 Torr in supply ballast chamber 12 after closure of on/off valve 22.

The present invention thus provides a number of advantages over conventional apparatus and methodology for rapidly effecting pressure changes in reduced pressure process/treatment chambers, particularly with "one-at-a-time" manufacturing apparatus such as utilizing reactive sputter deposition processing for fabrication of magnetic and/or magneto-optical (MO) recording media, e.g., hard disks. Further, utilization of the inventive apparatus and methodology as part of conventional manufacturing apparatus for hard disk recording media can be readily implemented, in view of the full compatibility of the invention with all other aspects of automated media manufacture. Finally, the inventive apparatus and methodology are broadly applicable to processing techniques utilized for the manufacture of a variety of different products, e.g., coated architectural glass and multi-layer optical coatings.

In the previous description, numerous specific details are set forth, such as specific materials, structures, processes, etc., in order to provide a better understanding of the present invention. However, the present invention can be practiced without resorting to the details specifically set forth. In other instances, well-known processing materials and techniques have not been described in detail, in order not to unnecessarily obscure the present invention.

Only the preferred embodiments of the present invention and but a few examples of its versatility are shown and described in the present invention. It is to be understood that the present invention is capable of use in various other embodiments and is susceptible of changes and/or modifications within the scope of the inventive concept as expressed herein.

What is claimed is:

1. An apparatus comprising:
(a) a chamber defining an interior space adapted to be maintained at a reduced pressure; and
(b) a gas supply means for supplying at least one burst of gas to said chamber for rapidly establishing at least one preselected gas pressure in said chamber, said gas supply means including:
(i) a source of said gas;
(ii) a supply ballast fluidly connected to said gas source for receiving said gas from said source;
(iii) at least one burst ballast fluidly connected to said supply ballast via a metering valve for receiving said gas from said supply ballast; and
(iv) an on/off valve fluidly connected to said at least one burst ballast and said chamber for supplying said process chamber with said gas from said at least one burst ballast and wherein:
said gas supply means is adapted for sequentially supplying a plurality of different bursts of gas to said chamber for rapidly establishing a respective plurality of preselected gas pressures in said chamber, said gas supply means including a plurality of burst ballasts fluidly connected to said supply ballast via respective metering valves, and a corresponding plurality of on/off valves fluidly connected to respective ones of said plurality of burst ballasts and said chamber for supplying said process chamber with said gas from a selected one of said plurality of burst ballasts.

2. The apparatus as in claim 1, wherein:
said chamber includes means for mounting at least one substrate/workpiece in said interior space.

3. The apparatus as in claim 2, wherein:
said means for mounting at least one substrate/workpiece in said interior space comprises means for mounting at least one disk-shaped substrate for a magnetic or magneto-optical (MO) recording medium.

4. The apparatus as in claim 2, wherein:
said chamber is a process chamber and includes means for performing at least one process treatment on said at least one substrate/workpiece.

5. The apparatus as in claim 1, further comprising:
(c) means for controlling operation of said on/off valve.

6. The apparatus as in claim 5, wherein:
said means for controlling operation of said on/off valve comprises computer control means.

7. An apparatus comprising:
(a) a chamber defining an interior space adapted to be maintained at a reduced pressure; and
(b) a gas supply means for supplying at least one burst of gas to said chamber for rapidly establishing at least one preselected gas pressure in said chamber, said gas supply means including:
(i) a source of said gas;
(ii) a supply ballast fluidly connected to said gas source for receiving said gas from said source;
(iii) at least one burst ballast fluidly connected to said supply ballast via a metering valve for receiving said gas from said supply ballast; and
(iv) an on/off valve fluidly connected to said at least one burst ballast and said chamber for supplying said process chamber with said gas from said at least one burst ballast
wherein:
said chamber includes means for performing at least one thin film deposition process on said at least one substrate/workpiece.

8. The apparatus as in claim 7, wherein:
said chamber includes means for performing at least one sputter deposition process on said at least one substrate/workpiece.

9. The apparatus as in claim 8, wherein:
said chamber includes means for performing at least one reactive sputter deposition process on said at least one substrate/workpiece, and said gas supply means supplies at least one reactive gas to said chamber.

10. An apparatus comprising:
(a) a chamber defining an interior space adapted to be maintained at a reduced pressure: and
(b) a gas supply means for supplying at least one burst of gas to said chamber for rapidly establishing at least one preselected gas pressure in said chamber, said gas supply means including:
  (i) a source of said gas:
  (ii) a supply ballast fluidly connected to said gas source for receiving said gas from said source:
  (iii) at least one burst ballast fluidly connected to said supply ballast via a metering valve for receiving said gas from said supply ballast: and
  (iv) an on/off valve fluidly connected to said at least one burst ballast and said chamber for supplying said process chamber with said gas from said at least one burst ballast, wherein:
said gas supply means is adapted for sequentially supplying first and second bursts of gas to said chamber for rapidly establishing respective first and second preselected gas pressures in said chamber, said gas supply means comprising first and second burst ballasts fluidly connected to said supply ballast via respective first and second metering valves, and first and second on/off valves respectively fluidly connected to said first and second burst ballasts and said chamber for supplying said process chamber with said gas from a selected one of said first and second burst ballasts.

11. A method, including steps for rapidly establishing at least one preselected gas pressure in a reduced pressure chamber, comprising steps of:
(a) providing an apparatus comprising:
  (i) a chamber defining an interior space adapted to be maintained at a reduced pressure; and
  (ii) a gas supply means for supplying at least one burst of gas to said chamber for rapidly establishing at least one preselected gas pressure in said chamber, said gas supply means including:
    (1) a source of said gas;
    (2) a supply ballast fluidly connected to said gas source for receiving said gas from said source;
    (3) at least one burst ballast fluidly connected to said supply ballast via a metering valve for receiving said gas from said supply ballast; and
    (4) an on/off valve fluidly connected to said at least one burst ballast and said chamber for supplying said process chamber with said gas from said at least one burst ballast
(b) providing said supply ballast with said gas from said source;
(c) providing said at least one burst ballast with said gas from said supply ballast;
(d) providing said chamber with a burst of said gas from said at least one burst ballast to establish said at least one preselected gas pressure in said chamber; and
(e) providing a steady flow of said gas from said at least one burst ballast to said chamber to maintain said at least one preselected gas pressure therein; wherein:
step (a) comprises providing a gas supply means adapted for sequentially supplying plurality of different bursts of gas to said chamber for rapidly establishing a respective plurality of preselected gas pressures in said chamber, said gas supply means including a plurality of burst ballasts fluidly connected to said supply ballast via respective metering valves, and a corresponding plurality of on/off valves fluidly connected to respective ones of said plurality of burst ballasts and said chamber for supplying said process chamber with said gas from a selected one of said plurality of burst ballasts.

12. The method according to claim 11, wherein:
step (a) comprises providing a process chamber including means for mounting at least one substrate/workpiece in said interior space and means for performing at least one process treatment on said at least one substrate/workpiece;
step (c) comprises equilibrating the gas pressure in said at least one burst ballast with the gas pressure in said supply ballast, while maintaining said on/off valve in a closed, off position, and setting the pressure x volume (PV) product of said gas in said burst ballast at a level sufficient to rapidly establish said at least one preselected gas pressure in said chamber in step (d);
step (d) comprises maintaining said on/off valve in an open, on position; and
step (e) comprises utilizing said metering valve to provide said steady flow of said gas from said at least one burst ballast to said chamber to maintain said at least one preselected gas pressure therein.

13. The method according to claim 12, wherein:
step (a) comprises providing a process chamber including means for mounting at least one substrate/workpiece in said interior space.

14. The method according to claim 13, wherein:
step (a) comprises providing a process chamber including means for mounting at least one disk-shaped substrate/workpiece for a magnetic or magneto-optical recording medium in said interior space.

15. A method, including steps for rapidly establishing at least one preselected gas pressure in a reduced pressure chamber, comprising steps of:
(a) providing an apparatus comprising:
  (i) a chamber defining an interior space adapted to be maintained at a reduced pressure; and
  (ii) a gas supply means for supplying at least one burst of gas to said chamber for rapidly establishing at least one preselected gas pressure in said chamber, said gas supply means including:
    (1) a source of said gas:
    (2) a supply ballast fluidly connected to said gas source for receiving said gas from said source:
    (3) at least one burst ballast fluidly connected to said supply ballast via a metering valve for receiving said gas from said supply ballast; and
    (4) an on/off valve fluidly connected to said at least one burst ballast and said chamber for supplying said process chamber with said gas from said at least one burst ballast
(b) providing said supply ballast with said gas from said source;
(c) providing said at least one burst ballast with said gas from said supply ballast;
(d) providing said chamber with a burst of said gas from said at least one burst ballast to establish said at least one preselected gas pressure in said chamber; and (e) providing a steady flow of said gas from said at least one burst ballast to said chamber to maintain said at least one preselected gas pressure therein, wherein:

step (a) comprises providing a process chamber including means for performing at least one thin film deposition process on said at least one substrate/workpiece.

16. The method according to claim 15, wherein:

step (a) comprises providing a process chamber including means for performing at least one sputter deposition process on said at least one substrate/workpiece.

17. The method according to claim 16, wherein:

step (a) comprises providing a process chamber including means for performing at least one reactive sputter deposition process on said at least one substrate/workpiece, and a source of gas including at least one reactive gas.

18. A method, including steps for rapidly establishing at least one preselected gas pressure in a reduced pressure chamber, comprising steps of:

(a) providing an apparatus comprising:
  (i) a chamber defining an interior space adapted to be maintained at a reduced pressure; and
  (ii) a gas supply means for supplying at least one burst of gas to said chamber for rapidly establishing at least one preselected gas pressure in said chamber, said gas supply means including:
    (1) a source of said gas;
    (2) a supply ballast fluidly connected to said gas source for receiving said gas from said source;
    (3) at least one burst ballast fluidly connected to said supply ballast via a metering valve for receiving said gas from said supply ballast; and
    (4) an on/off valve fluidly connected to said at least one burst ballast and said chamber for supplying said process chamber with said gas from said at least one burst ballast (b) providing said supply ballast with said gas from said source;

(c) providing said at least one burst ballast with said gas from said supply ballast;

(d) providing said chamber with a burst of said gas from said at least one burst ballast to establish said at least one preselected gas pressure in said chamber; and (e) providing a steady flow of said gas from said at least one burst ballast to said chamber to maintain said at least one preselected gas pressure therein wherein:

step (a) comprises providing a gas supply means adapted for sequentially supplying first and second bursts of gas to said chamber for rapidly establishing respective first and second preselected gas pressures in said chamber, said gas supply means comprising first and second burst ballasts fluidly connected to said supply ballast via respective first and second metering valves, and first and second on/off valves respectively fluidly connected to said first and second burst ballasts and said chamber for supplying said process chamber with said gas from a selected one of said first and second burst ballasts.

* * * * *